United States Patent
Kim et al.

(10) Patent No.: US 8,203,881 B2
(45) Date of Patent: Jun. 19, 2012

(54) NONVOLATILE MEMORY DEVICE, METHOD OF OPERATING NONVOLATILE MEMORY DEVICE AND MEMORY SYSTEM INCLUDING NONVOLATILE MEMORY DEVICE

(75) Inventors: Nam-Hoon Kim, Suwon-si (KR); Jun-Ho Jang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 348 days.

(21) Appl. No.: 12/656,714

(22) Filed: Feb. 16, 2010

(65) Prior Publication Data

US 2010/0208521 A1 Aug. 19, 2010

(30) Foreign Application Priority Data

Feb. 17, 2009 (KR) .................. 10-2009-0013015

(51) Int. Cl.
*G11C 11/34* (2006.01)
*G11C 16/04* (2006.01)
*G11C 16/06* (2006.01)
(52) U.S. Cl. .................. 365/185.09; 365/185.02
(58) Field of Classification Search ............ 365/185.02, 365/185.09
See application file for complete search history.

(56) References Cited

FOREIGN PATENT DOCUMENTS

| KR | 1020050072687 | 7/2005 |
|---|---|---|
| KR | 1020060023128 | 3/2006 |
| KR | 1020070107676 | 11/2007 |
| KR | 1020080080529 | 9/2008 |

*Primary Examiner* — Ly D Pham
(74) *Attorney, Agent, or Firm* — Harness, Dickey & Pierce (57) ABSTRACT

The method of operating the nonvolatile memory device may include performing a read operation on a first address region, comparing a read time of the first address region with a reference time, and storing read data from the read from the first address region in a second address region based on the comparison result.

20 Claims, 7 Drawing Sheets

NONVOLATILE MEMORY DEVICE, METHOD OF OPERATING NONVOLATILE MEMORY DEVICE AND MEMORY SYSTEM INCLUDING NONVOLATILE MEMORY DEVICE

CROSS-REFERENCE TO RELATED APPLICATIONS

This U.S. non-provisional patent application claims priority under 35 U.S.C. §119 of Korean Patent Application No. 10-2009-0013015, filed on Feb. 17, 2009, the entire contents of which are hereby incorporated by reference.

BACKGROUND

1. Technical Field

Example embodiments relate to semiconductor memory devices, for example, to nonvolatile memory devices, methods of operating nonvolatile memory devices and memory systems including nonvolatile memory devices.

2. Description of Related Art

A semiconductor memory device is a memory device that can store data and readout the stored data when necessary. A semiconductor memory device is classified into a volatile memory device and a nonvolatile memory device.

A volatile memory device loses stored data when its power supply is interrupted. Examples of volatile memory devices include SRAM, DRAM and SDRAM. A nonvolatile memory device maintains stored data even when its power supply is interrupted. Examples of nonvolatile memory device include ROM, PROM, EPROM, EEPROM, a flash memory device, PRAM, MRAM and FRAM. A flash memory device is classified into a NOR-type flash memory and a NAND-type flash memory.

SUMMARY

According to example embodiments, a method of operating a nonvolatile memory device may include performing a read operation on a first address region, comparing a read time of the first address region with a reference time, and storing read data from the read from the first address region in a second address region based on the comparison result.

Example embodiments may also provide a nonvolatile memory device. The nonvolatile memory device may include a memory cell array, a read/write circuit configured to write data in the memory cell array and readout data from the memory cell array, and control logic configured to control the read/write circuit according to the method of operating the nonvolatile memory device. The control logic controls the read/write circuit so that the read data is stored in the second address region of the memory cell array if the read time of the first address region of the memory cell array is longer than the reference time.

Example embodiments may also provide a memory system. The memory system may include a nonvolatile memory device and a controller configured to control the nonvolatile memory device according to the method of operating the nonvolatile memory device. The controller is configured to control the nonvolatile memory device so that the read data is stored in the second address region of the nonvolatile memory device if the read time of the first address region of the nonvolatile memory device is longer than the reference time.

BRIEF DESCRIPTION OF THE DRAWINGS

The accompanying drawings are included to provide a further understanding of example embodiments, and are incorporated in and constitute a part of this specification. The drawings illustrate example embodiments and, together with the description, serve to explain principles of example embodiments. In the figures.

DETAILED DESCRIPTION

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures. The figures are intended to depict example embodiments and should not be interpreted to limit the intended scope of the claims. The accompanying figures are not to be considered as drawn to scale unless explicitly noted.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof. In this specification, the term "and/or" picks out each individual item as well as all combinations of them.

Example embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Now, in order to more specifically describe example embodiments, example embodiments will be described in detail with reference to the attached drawings. However, example embodiments are not limited to the embodiments described herein, but may be embodied in various forms.

When it is determined that a detailed description related to a related known function or configuration may make the purpose of example embodiments unnecessarily ambiguous, the detailed description thereof will be omitted. Also, terms used herein are defined to appropriately describe example embodiments and thus may be changed depending on a user, the intent of an operator, or a custom. Accordingly, the terms must be defined based on the following overall description within this specification.

A method of operating a nonvolatile memory device in accordance with example embodiments includes performing a read operation on a first address region, comparing a read time of a first address region with a reference time and storing read data according to a comparison result in a second address region.

A nonvolatile memory device in accordance with example embodiments includes a memory cell array, a read/write circuit configured to write and readout data in the memory cell array and a control logic configured to control the read/write circuit. When a read time on the first address region of the memory cell array is longer than the reference time, the control logic controls the read/write circuit so that data readout from the first address region is stored in the second address region of the memory cell array.

A memory system in accordance with example embodiments includes a nonvolatile memory device and a controller configured to control a nonvolatile memory device. When a read time on the first address region of the nonvolatile memory device is longer than the reference time, the controller controls the nonvolatile memory device so that data readout from the first address region is stored in the second address region of the nonvolatile memory device.

Example embodiments will be described below in more detail with reference to the accompanying drawings. Example embodiments may, however, be embodied in different forms and should not be constructed as limited to the embodiments set forth herein. Rather, these embodiments are provided so that this disclosure will be thorough and complete, and will fully convey the scope of example embodiments to those skilled in the art. Like numbers refer to like elements throughout.

Figure 1:
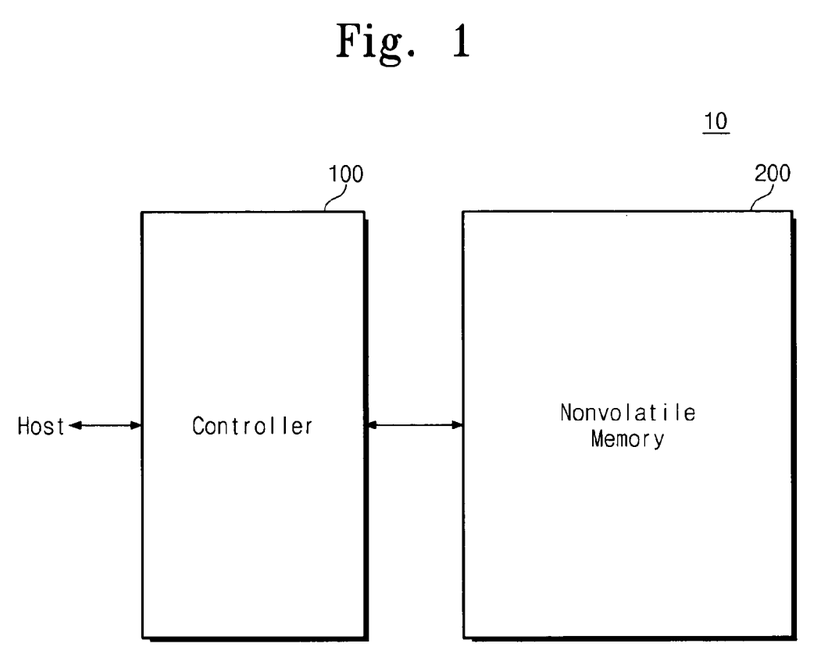
FIG. 1 is a block diagram illustrating a memory system in accordance with example embodiments.

FIG. 1 is a block diagram illustrating a memory system in accordance with example embodiments. Referring to FIG. 1, a memory system 10 in accordance with example embodiments includes a controller 100 and a nonvolatile memory device 200.

The controller 100 is connected to a Host and the nonvolatile memory device 200. The controller 100 transmits data read from the nonvolatile memory device 200 to the Host and stores data transmitted from the Host in the nonvolatile memory device 200.

The controller 100 may include well known constituents such as a RAM, a processing unit, a host interface and a memory interface. The RAM may be used as an operation memory of the processing unit. The processing unit may control every operation of the controller 100.

The host interface may include a protocol to exchange data between the Host and the controller 100. For example, the controller 100 may be configured to communicate with an external device (Host) through one of various interface protocols such as USB, MMC, PCI-E, ATA (advanced technology electronics), serial-ATA, parallel-ATA, SCSI, ESDI, and IDE (integrated drive electronics). The memory interface of the controller 100 may interface with the memory device 200.

The nonvolatile memory device 200 may include a memory cell array to store data, a read/write circuit to readout data from the memory cell array and write data in the memory cell array, an address decoder decoding an address transmitted from an external device to transmit to the read/write circuit and a control logic to control every operation of the nonvolatile memory device 200. The nonvolatile memory device 200 in accordance with example embodiments will be described in detail with reference to FIG. 2.

The controller 100 and the nonvolatile memory device 200 may be integrated in one semiconductor device. In an example embodiment, the controller 100 and the nonvolatile memory device 200 may be integrated in one semiconductor device to constitute a memory card. The controller 100 and the nonvolatile memory device 200 may be integrated in one semiconductor device to constitute a PC card (PCMCIA), a compact flash card (CF), a smart media card (SM/SMC), a memory stick, a multimedia card (MMC, RS-MMC, MMC-micro), a SD card (SD, miniSD, microSD), a universal flash memory device (UFS).

In another example embodiment, the controller 100 and the nonvolatile memory device 200 may be integrated in one semiconductor device to constitute a solid state disk/drive (SSD). When the memory system 10 is used as a solid state disk/drive (SSD), an operation speed of Host connected to the memory system 10 will be greatly improved.

The memory system 10 may be applied to one of a computer, a portable computer, UMPC, a workstation, a net-book, PDA, a web tablet, a wireless phone, a mobile phone, a smart phone, a digital camera, a digital audio recoder/player, a digital still/moving image recorder/player, a device capable of transmitting/receiving data in an wireless environment and various electronic devices constituting a home network, one of various electronic devices constituting a computer network, one of various electronic devices constituting a telematics network, or one of various constituents constituting a computing system such as a solid state drive (SSD) or a memory card.

The nonvolatile memory device 200 or the memory system 10 may be mounted by various types of packages. For example, the nonvolatile memory device 200 or the memory system 10 may be mounted by packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), and wafer-level processed stack package (WSP).

Figure 2:
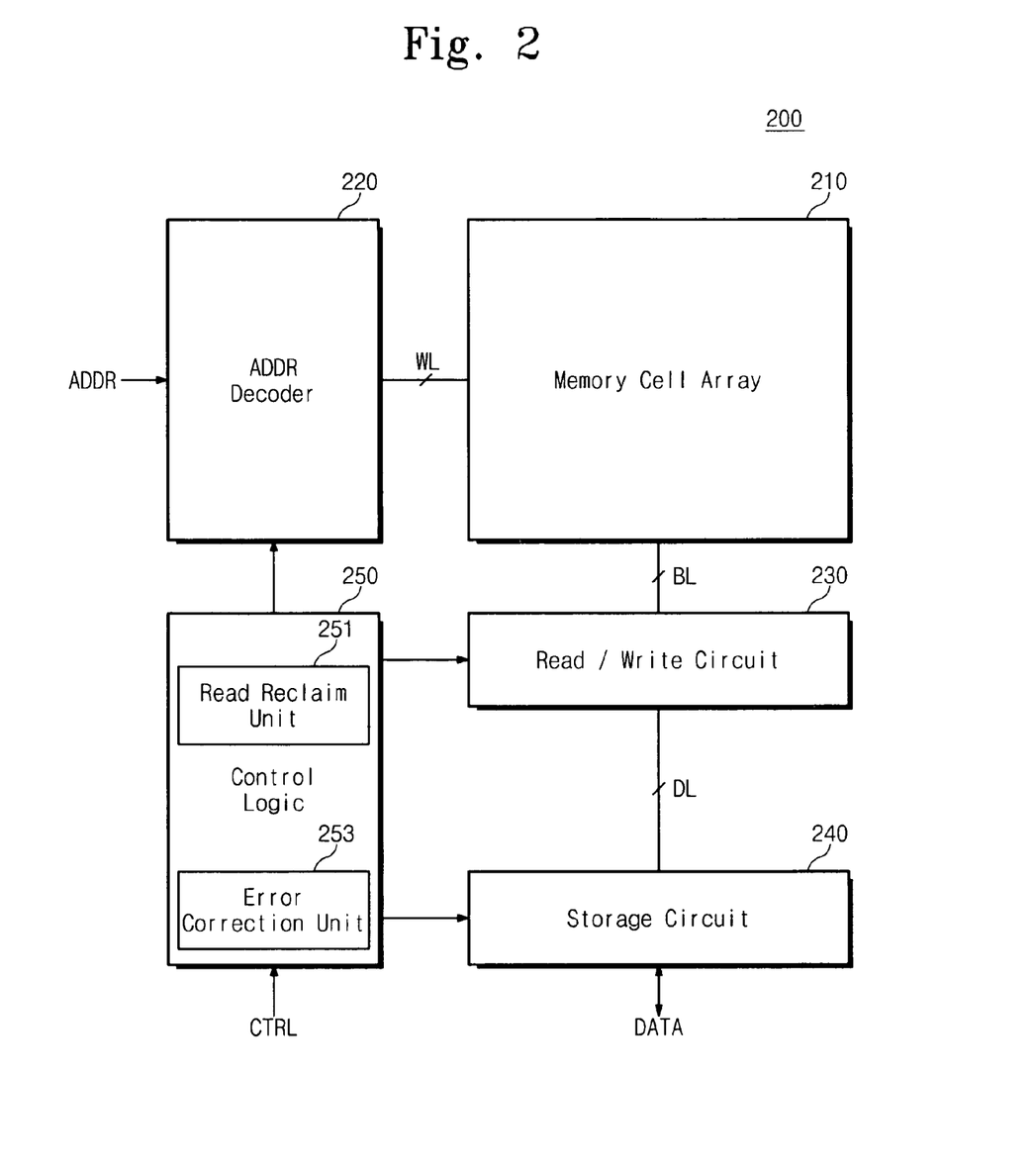
FIG. 2 is a block diagram illustrating a nonvolatile memory device of FIG. 1.

FIG. 2 is a block diagram illustrating the nonvolatile memory device 200 of FIG. 1. Referring to FIG. 2, the nonvolatile memory device 200 may include a memory cell array 210, an address decoder 220, a read/write circuit 230, a storage circuit 240 and control logic 250.

The memory cell array 210 is connected to the address decoder 220 through word lines (WL) and connected to the read/write circuit 230 through bit lines (BL). The memory cell array 210 includes a plurality of memory cells (not shown). Rows of the memory cells may be connected to the address decoder 220 through the word lines (WL). Columns of the memory cells may be connected to the read/write circuit through the bit lines (BL). Read and write operations may be performed on the memory cells connected to a selected word line and a selected bit line.

The address decoder 220 is connected to the memory cell array 210 through the word lines (WL). The address decoder 220 operates in response to a control of the control logic 250. The address decoder 220 receives an address (ADDR) from an external device. For example, the address (ADDR) may be provided from the controller 100 of FIG. 1. The address decoder 220 decodes a row address among transmitted addresses to select word addresses (WL). The address decoder 220 decodes a column address among transmitted addresses to transmit the decoded address to the read/write circuit 230. The address decoder 220 may include well known constituents such as an address buffer, a row decoder and a column decoder.

The read/write circuit 230 is connected to the memory cell array 210 through the bit lines (BL) and is connected to the storage circuit 240 through data lines (DL). The read/write circuit 230 operates in response to a control of the control logic 250. The read/write circuit 230 may receive the decoded column address from the address decoder 220, for example, through the control logic 250. The read/write circuit 230 selects the bit lines (BL) on the basis of the decoded column address.

The read/write circuit 230 may store data transmitted through the data lines (DL) in the memory cell array 210. The read/write circuit 230 may read data stored in the memory cell array 210 and may transmit the read data to the storage circuit 240 through the data lines (DL). The read/write circuit 230 may read data stored in a first storage region of the memory cell array 210 and may store the read data in a second storage region of the memory cell array 210. Thus, the read/write circuit 230 may also perform a copy-back operation.

The read/write circuit 230 may include well known constituents such as a write driver, a sense amplifier and a column select circuit. For example, the write driver of the read/write circuit 230 may include a storage circuit (having, for example, a resister, a latch, a buffer, etc.) to store data to be written in the memory cell array 210. The sense amplifier of the read/write circuit 230 may also include a storage circuit (having for example, a resister, a latch, a buffer, etc.) to store data sensed from the memory cell array 210. In example embodiments, the read/write circuit 230 may also include a storage circuit (having for example, a resister, a latch, a buffer, etc.) to store data to be written in the memory cell array 210 by the write driver or to store data sensed from the memory cell array 210 by the sense amplifier.

The read/write circuit 230 may further include well known constituents such as a page buffer and a column select circuit. The nonvolatile memory device 200 provided by the page buffer may be a flash memory device. The page buffer of the read/write circuit 230 may include a storage circuit (having for example, a resister, a latch, a buffer, etc.) to store data to be written in the memory cell array 210 and to store data sensed from the memory cell array 210.

The storage circuit 240 communicates with the read/write circuit 230 through the data lines (DL). The storage circuit 230 operates in response to a control of the control logic 250. The storage circuit 250 exchanges data (DATA) with an external device. For example, the storage circuit 240 may exchange data with the controller 100 of FIG. 1. The storage circuit 240 may be provided to store write data transmitted from an external device and read data read from the memory cell array 210. The storage circuit 240 may be includes components such as a latch, a resister, a buffer, etc. The storage circuit 240 may operate as a data input/output buffer of the nonvolatile memory device 240.

The control logic 250 is connected to the address decoder 220, the read/write circuit 230 and the storage circuit 240. The control logic 250 may control every operation of the nonvolatile memory device 200. The control logic 250 operates in response to a control signal (CTRL) transmitted from an external device. For example, the control signal may be provided from the controller 100 of FIG. 1.

The control logic 250 may include a read reclaim unit 251 and an error correction unit 253. The read reclaim unit 251 is configured to control a read reclaim operation of the nonvolatile memory device 200. The error correction unit 253 is configured to correct data errors sensed from the memory cell array 210.

The read reclaim unit 251 and the read reclaim operation will be described in further detail below. Example embodiments will be described with reference to a flash memory device. However, example embodiments are not limited to the flash memory device. For example, example embodiments may also be applied to a nonvolatile memory device including ROM, PROM, EPROM, EEPROM, a flash memory device, PRAM, MRAM, RRAM and FRAM. Thus, example embodiments may be applied to various kinds of memory devices in which the read reclaim operation is required.

The memory cell array 210 of the flash memory device 200 may include a plurality of memory cells. Each of the memory cells store one or more bits. If the memory cell array 210 stores one bit per cell, memory cells connected to one word line form one page. If the memory cell array 210 stores n bits per cell (where n is greater than 1), memory cells connected to one word line form n pages. For example, least significant bits (LSB) stored of memory cells may form the least significant page, most significant bits (MSB) stored of memory cells may form the most significant page and n−2 central significant bits stored of memory cells may form the n−2 central significant page.

A read operation of the flash memory device 200 may be performed by page unit. For example, when a read operation is performed, data stored in one page is concurrently read. A unit of a read operation shall be called an address region. If a read operation is performed by page units like the flash memory device 200, an address region of the flash memory device may be a page. For example, an address region of the memory device of which a read operation is performed by k bit units, an address region may be formed of k bits.

If a read characteristic of data stored in the first address region is low, the read reclaim operation is an operation to improve a read characteristic of data by reading data stored in the first address region to store the read data in the second address region. The read characteristic of data represents whether data stored in the first address region can be normally read through a read operation.

When a read operation is performed in the flash memory device 200, a first read voltage (Vrd) is applied to a word line connected to a select address region (page). The first read voltage (Vrd) is a voltage to discriminate a logic state of memory cells. The first read voltage (Vrd) has a level between threshold voltages of erased memory cells and threshold voltages of programmed memory cells.

When a read operation is performed, a second read operation (Vread) is applied to word lines connected to unselected address regions (pages). The second read voltage (Vread) is a voltage to turn on memory cells regardless of logic states of memory cells. For example, the second read voltage (Vread) may have a voltage level higher than the threshold voltages of programmed memory cells. When the second read voltage (Vread) is applied to a control gate of memory cells of erased state, the memory cells of erased state may be softly programmed by F-N tunneling. If a read operation is continuously performed, so the second read voltage (Vread) is continuously applied to memory cells of an erased state, memory cells of erased state may be discriminated to be memory cells of a programmed state. For example, if a read operation repeats, read characteristic of data of an address region may become low.

If an amount time elapses exceeding a threshold based on characteristics of the memory cells after data is stored in memory cells, charges may flow out of charge storage layers of programmed memory cells. If charges flow out of charge storage layers of programmed memory cells, threshold voltages of programmed memory cells may become low. If enough charges flow out of programmed memory cells, the programmed memory cells may be discriminated to be memory cells of erased state. For example, if the amount of time elapsed exceeds the threshold after data is stored in memory cells, read characteristic of data of an address region may become low.

Figure 3:
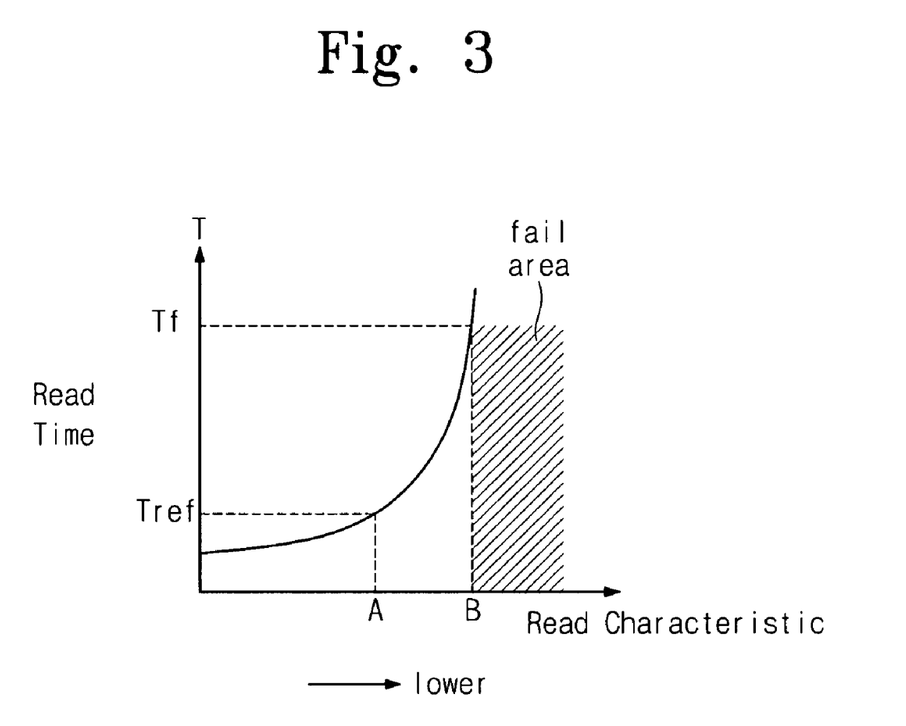
FIG. 3 is a diagram illustrating a read time in accordance with a read characteristic of an address region.

FIG. 3 is a diagram illustrating a read time in accordance with a read characteristic of an address region. In FIG. 3, a horizontal axis represents a read characteristic of an address region and a vertical axis represents a read time of corresponding address region. In FIG. 3, a read characteristic of an address region becomes lower going in a horizontal axis direction.

Referring to FIGS. 2 and 3, as a read characteristic of an address region becomes lower as read time increases. A read time may include a time between which data stored in the first address region of the memory cell array is sensed by the read/write circuit 230 and a post-sensing process time.

The post-sensing process may include an error correction process for correcting errors of sensed data. As described above, memory cells of erased state may be discriminated to be programmed memory cells due to a program disturbance by a read voltage. Also, programmed memory cells may be discriminated to be in an erased state due to an outflow of charge according to a time lapse. For example, as a read operation repeats and time elapses, the number of error bits of data stored in an address region may increase. Thus, as a read characteristic of an address region becomes low, a read time may increase.

The post-sensing process may include discriminating whether data sensed from an address region represents an erased state or programmed state. As described above, if a read operation repeats, threshold voltages of memory cells of erased state may become high. Also, if a time elapses, threshold voltages of programmed memory cells may become low. A time necessary to discriminate which of an erased state and a programmed state data sensed from an address region represents may increase. Thus, as read characteristic of an address region deteriorates, a read time may increase.

As shown in FIG. 3, if read characteristic of an address region is lower than a predetermined degree (B), a read fail may occur. For example, if errors more than the number of errors which can be corrected by the error correction unit 253 occur in the sensed data, a read fail may occur. Also, if a read time of an address region becomes longer than a threshold time (Tf), a read fail may occur.

The nonvolatile memory device 200 in accordance with example embodiments performs a read reclaim operation according to a read time of an address region. The nonvolatile memory device 200 in accordance with example embodiments performs a reclaim operation by performing a read operation on a first address region, comparing a read time of the first address region with a reference time and storing read data in a second address region according to a comparison result. If a read time of the first address region is longer than a reference time, a read reclaim operation may be performed. A read operation of the first address region may include a sensing process and a post-sensing process.

The reference time may be a time (e.g., Tref) that is shorter than a threshold or fail time (Tf). For example, the nonvolatile memory device 200 in accordance with example embodiments performs a read reclaim operation on a corresponding region at a time (Tref) before a read time of an address region reaches the fail time (Tf) and at a characteristic (A) before a read characteristic of an address region reaches fail characteristic (B). Thus, reliability of the nonvolatile memory device 200 may be improved.

Figure 4:
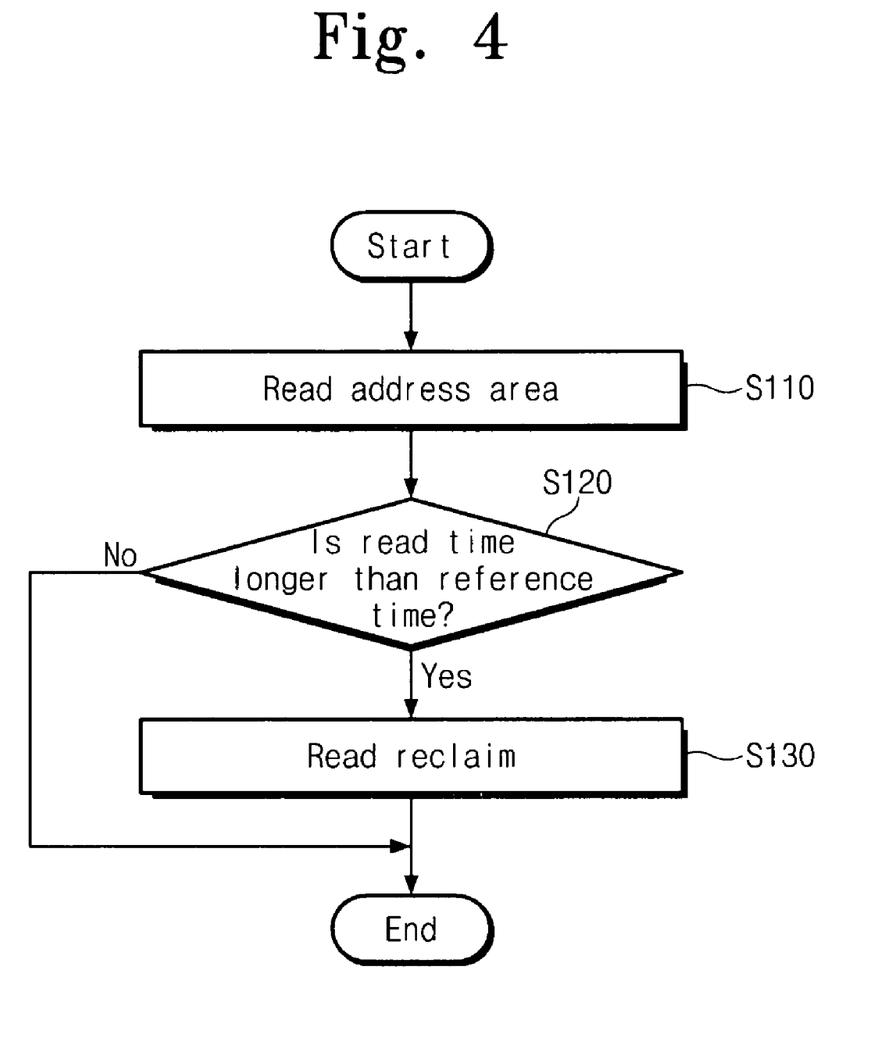
FIG. 4 is a flow chart illustrating a read reclaim operation of a nonvolatile memory device of FIG. 2.

FIG. 4 is a flow chart illustrating read reclaim operation of the nonvolatile memory device 200 of FIG. 2. Referring to FIGS. 2 and 4, in a step of S110, a read operation is performed on the first address region. A read operation of the first address region includes a sensing process and a post-sensing process.

Data stored in the first address region of the memory cell array 210 may be sensed by the read/write circuit 230. A post-sensing process may be performed on the sensed data. The post-sensing process may include an error correction operation correcting errors occurred when a read operation is performed. The post-sensing process may also include an operation discriminating a logic state of the sensed data. The post-sensing process may include operations based on data representing a characteristic of the first address region like data read from a spare field and a flag field corresponding to the first address region. The post-sensing process will be described in further detail referring to an error correction operation below. However, the post-sensing operation may not be limited to an error correction operation.

Data sensed from the first address region of the memory cell array 210 may be stored in a storage circuit (having for example a resister, latch, buffer, etc.) of the read/write circuit 230. The error correction unit 253 may correct an error of data stored in the storage circuit of the read/write circuit 230.

Data sensed from the first address region of the memory cell array 210 may be transmitted to the storage circuit 240 (having for example a resister, latch, buffer, etc.) through data lines (DL). The error correction unit 253 may correct an error of data stored in the storage circuit 240.

For example, the read time of the first address region may include a time that data stored in the first address region is sensed by the read/write circuit 230 and a time of a post-sensing process that an error of sensed data is corrected by the error correction unit 253.

As read characteristics of data stored in the first address region deteriorate, a post-sensing process time on the data sensed from the first address region may increase. As the number of error bits of data stored in the first address region increases, a time required to correct errors may also increase. Thus, as read characteristics of data stored in the first address region becomes lower, a read time of the first address region may increase.

Referring to FIGS. 2 and 4, in a step of S120, whether a read time is longer than a reference time or not is discriminated. A comparison between the read time and the reference time may be performed by the read reclaim unit 251. The reference time is a time to detect read characteristics of data stored in the first address region. The reference time may be set so that the number of error bits of data sensed from the first address region is less than the number of error bits which can be corrected by the error correction unit 253.

If a read time is shorter than the reference time, data stored in the first address region may be discriminated not to require a read reclaim. Thus, a read reclaim is not performed. Data read from the first address region of the memory cell array 210 may be transmitted to an external device through the storage circuit 240. Data read from the first address region may be transmitted to the controller 100 of FIG. 1.

If a read time of the first address region is longer than the reference time, data stored in the first address region may be discriminated to require a read reclaim. Thus, in a step of S130, a read reclaim may be performed.

Assuming that an error correction operation is performed on data which is sensed from the first address region to be stored in the read/write circuit 230, data corrected by the error correction unit 253 may be transmitted to an external device through data lines (DL). Also, error corrected data stored in the read/write circuit 230 may be stored in the second address region of the memory cell array 210.

Assuming that an error correction operation is performed on data which is sensed from the first address region to be stored in the storage circuit 240, data corrected by the error correction unit 253 may be transmitted to an external device. Also, error corrected data is transmitted to the read/write circuit 230 to be stored in the second address region of the memory cell array 210.

The read reclaim unit 251 may count the number of times that a read time of the first address region is longer than the reference time. If the counted value is greater than a threshold value, the read reclaim unit 251 may perform a read reclaim operation.

If a read time of the first address region is longer than the reference time, a first memory block including the first address region may be stored in a second memory block including the second address region. Thus, the read reclaim operation may be performed by block unit.

If an address region having a read time longer than the reference time exists among address regions of the first memory block, a read reclaim may be performed on the first memory block. Also, if the number of times that a read time of one of address regions of the first memory block is longer than the reference time is greater than a threshold number, a read reclaim operation may be performed on the first memory block. If the number of times that a read time of address regions of the first memory block is longer than the reference time is greater than a threshold number, a read reclaim operation may be performed on the first memory block.

The reference time may be set to a multiple of an integer of an average read time of address regions of the memory cell array 210. If the memory cell array 210 stores a plurality of bits per cell, the most significant bits (MSB) among the bits stored in memory cells may form the most significant address region. Read characteristics of the most significant address region may be lower than an address region under the most significant address region. Thus, it will be understood that the reference time may be set to multiple of an integer of an average read time of address regions of the memory cell array 210.

The read reclaim unit 251 or the error correction unit 253 may be embodied in a hardware type of a digital circuit, an analog circuit or combinations thereof. The read reclaim unit 251 or the error correction unit 253 may be embodied in a software type driven in the control logic 250. The read reclaim unit 251 or the error correction unit 253 may be embodied in a type of combinations of hardware and software.

In the embodiments described above, the read reclaim unit 251 and the error correction unit 253 were described to be constituents of the control logic 250. However, the read reclaim unit 251 and the error correction unit 253 are not limited to being constituents of the control logic 250. For example, the read reclaim unit 251 or the error correction unit 253 may form a separate block different from the control logic 250.

Figure 5:
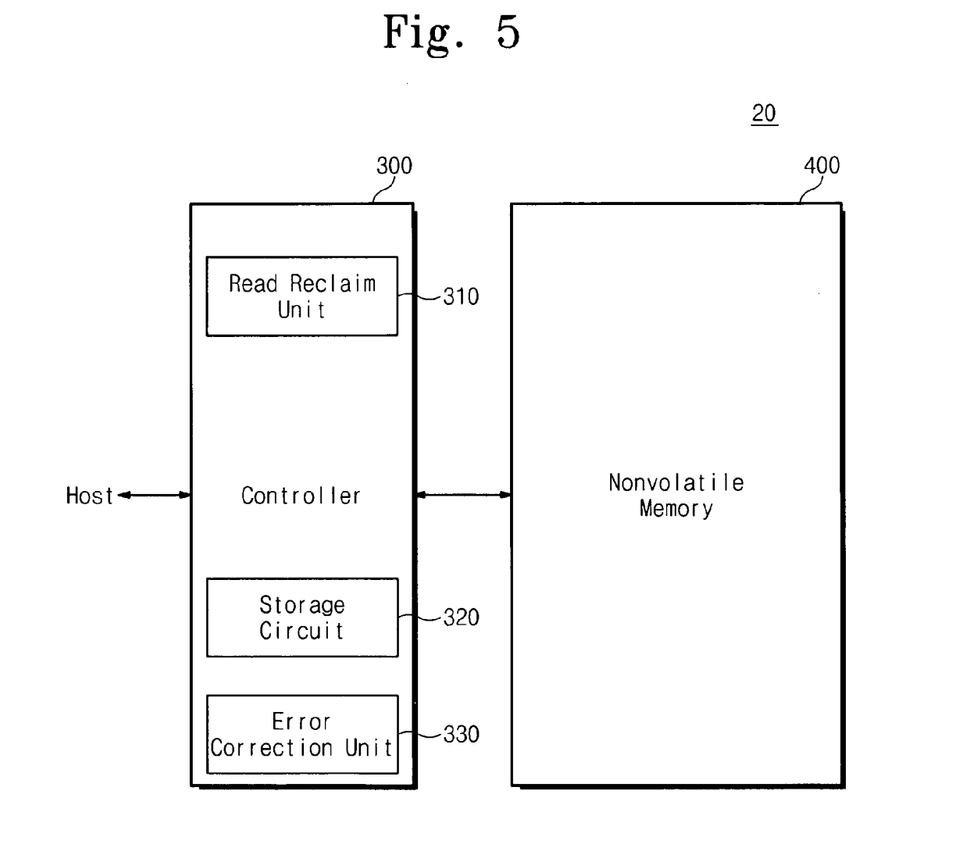
FIG. 5 is another block diagram illustrating a memory system in accordance with example embodiments.

FIG. 5 is another block diagram illustrating a memory system 20 in accordance with example embodiments. Referring to FIG. 5, the memory system 20 in accordance with example embodiments includes a controller 300 and a nonvolatile memory device 400.

As described referring to FIG. 1, the controller 300 may include well known constituents such as RAM, a processing unit, a host interface and a memory interface. The controller 300 may communicate with a Host using one of various interfaces. The nonvolatile memory device 400 may include constituents such as a memory cell array, an address decoder, a read/write circuit, a data input/output buffer and control logic.

The controller 300 and the nonvolatile memory device 400 may be integrated in one semiconductor device to form a solid state disk/drive (SSD) or a memory card. The controller 300 and the nonvolatile memory device 400 may be applied as various types of electronic devices. The controller 300 and the nonvolatile memory device 400 may be mounted by various types of packages.

The controller 300 of the memory system 20 in accordance with example embodiments includes a read reclaim unit 310, a storage circuit 320 and an error correction unit 330.

The read reclaim unit 310 operates in the same manner as the read reclaim unit 251. For example, the read reclaim unit 310 is configured to compare a read time of a first address region of the nonvolatile memory device 400 with a reference time, and then perform a read reclaim on the first address region according to a comparison result. The read time may include a time that data is sensed in an address region of the nonvolatile memory device 400 and a time that the sensed data is transmitted to the controller 300 and a post-sensing process is performed on the transmitted data. The post-sensing process is described in further detail with respect to the error correction operation.

The storage circuit 320 is configured to store data transmitted from the nonvolatile memory device 400. The storage circuit 320 may include a resister, a latch, a buffer, etc.

The error correction unit 330 is configured to correct errors of data transmitted from the nonvolatile memory device 400. The data transmitted from the nonvolatile memory device 400 may be stored in the storage circuit 320. The error correction unit 330 is configured to correct errors of data stored in the storage circuit 320.

If a read time including a time that data is sensed in the nonvolatile memory device 400 and a time that a post-sensing process is performed on the controller 300 is longer than a reference time, the read reclaim unit 310 may control the nonvolatile memory device 400 so that a read reclaim operation is performed.

As described with reference to FIGS. 1 through 4, the reference time may be set to multiple of an integer of an average read time of an address region or multiple of an integer of an average read time of the most significant address region.

As described with reference to FIGS. 1 through 4, the read reclaim operation may be performed when a read time of an address region is longer than the reference time or when the number of times that a read time of an address region is longer than the reference time is greater than the threshold number.

As described with reference to FIGS. 1 through 4, the read claim operation may be performed by block unit. For example, the read reclaim operation may be performed when a read time of one address region of memory block is longer than the reference, the number of times that a read time of an address region of one memory block is longer than the reference is greater than the threshold number or the number of times that read times of address regions of memory block are longer than the reference is greater than the threshold number.

As described with reference to FIGS. 1 through 4, the read reclaim unit 310 or the error correction unit 330 may be embodied in a hardware type of a digital circuit, an analog circuit or combinations thereof. The read reclaim unit 310 or the error correction unit 330 may be embodied in a software type driven in the controller 300. The read reclaim unit 310 or the error correction unit 330 may be embodied in a type of combinations of hardware and software.

Figure 6:
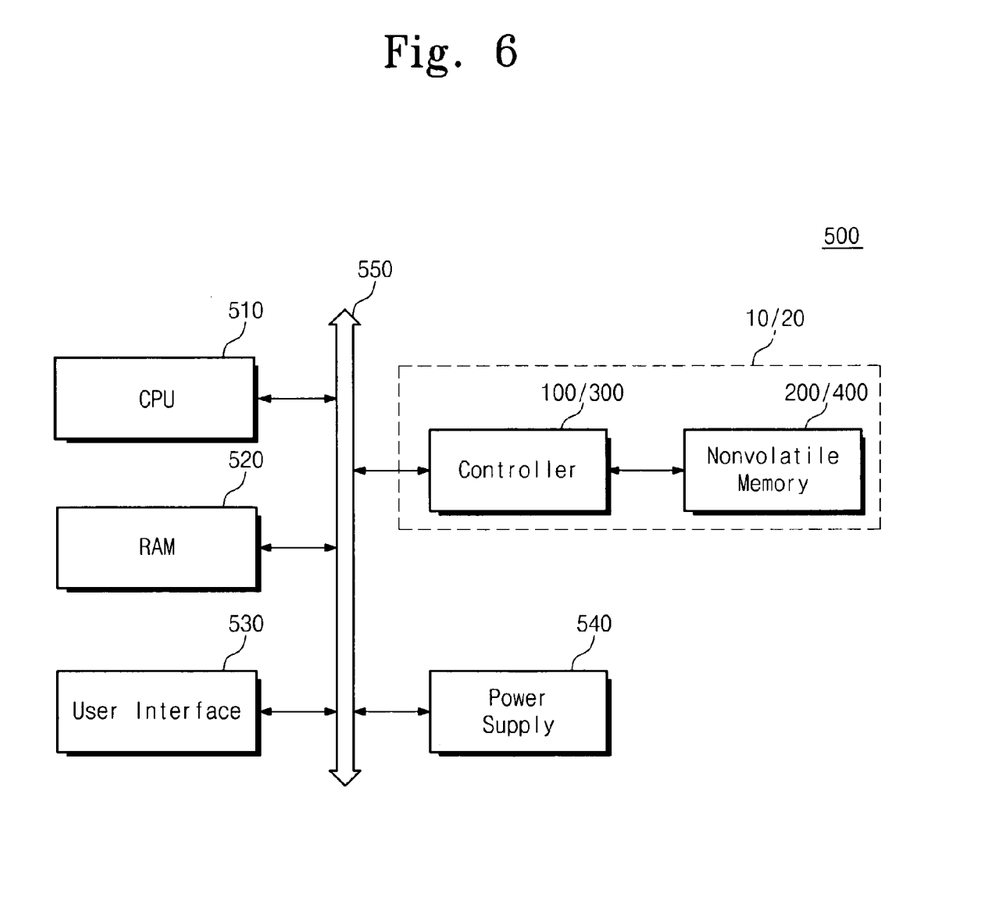
FIG. 6 is a block diagram illustrating a computing system including the memory system of FIGS. 1 and 5.

FIG. 6 is a block diagram illustrating a computing system 500 including the memory systems 10 and 20 of FIGS. 1 and 5. Referring to FIG. 6, the computing system 500 in accordance with example embodiments includes a central process unit (CPU) 510, a random access memory (RAM) 520, a user interface 530, a power supply 540 and a memory system 10/20.

The memory system 10/20 is electrically connected to the central process unit (CPU) 510, the random access memory (RAM) 520, the user interface 530, the power supply 540 through a system bus 550. Data provided through the user interface 530 or processed by the central process unit (CPU) 510 is stored in the memory system 10/20. The memory system 10/20 includes a controller 100/300 and a nonvolatile memory device 200/400. The memory system 10/20 may be configured to perform a read reclaim operation in accordance with a comparison between a read time and a reference time.

If the memory system 10/20 is built in the computing system 500 as a solid state disk/drive (SSD), a booting speed of the computing system 500 may greatly increase. The computing system 500 may further include an application chipset and a camera image processor.

Figure 7:
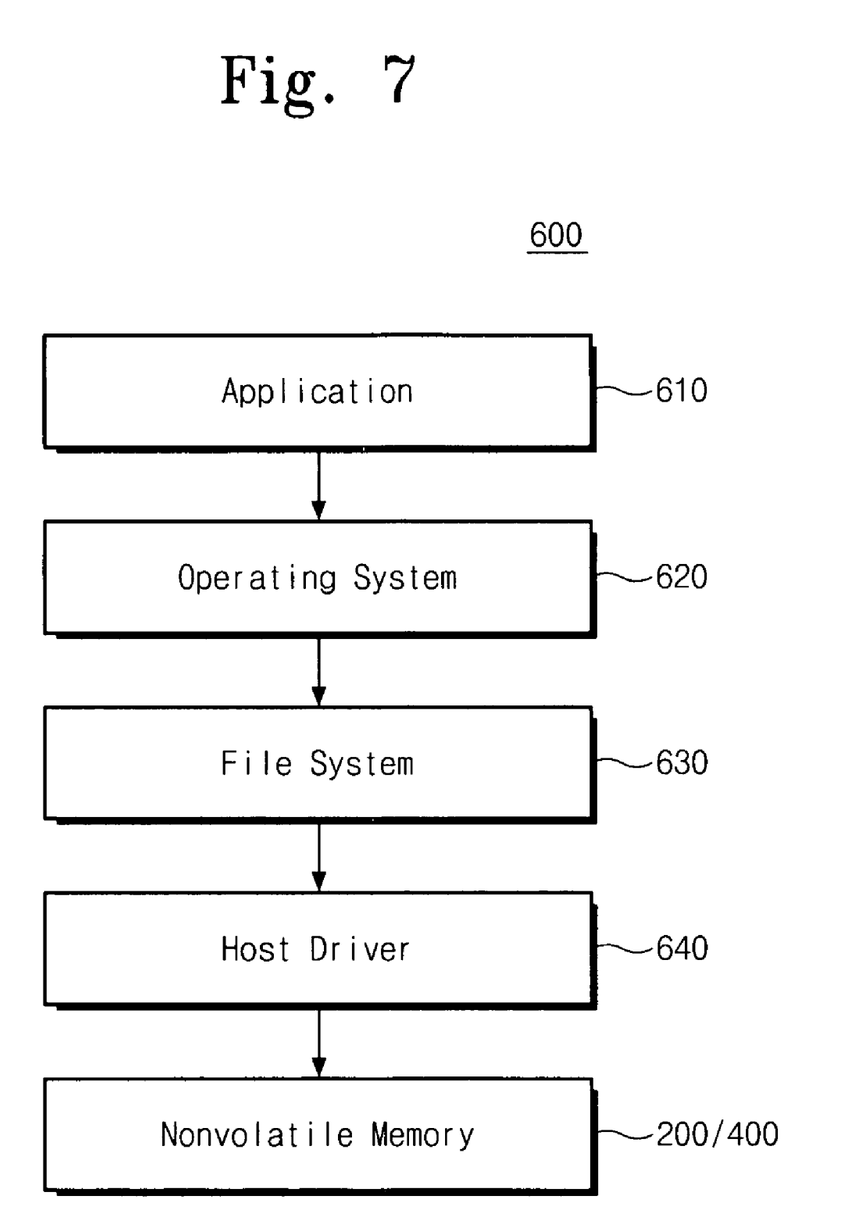
FIG. 7 is a block diagram illustrating a software level of the computing system of FIG. 6.

FIG. 7 is a block diagram illustrating a software level 600 of the computing system 500 of FIG. 6. Referring to FIG. 7, the software level 600 of the computing system 500 in accordance with example embodiments includes an application 610, an operating system 620, a file system 630, a host driver 640 and a nonvolatile memory device 200/400.

The application 610 may represent various application programs driven in the computing system 500. For example, the application 610 may include a text editor, a spreadsheet, a database, an interne explorer, a voice regenerator or an image regenerator. The application 610 may be driven by the central processing unit (CPU) 510 of the computing system 500.

The operating system 620 may control every operation of the computing system 500. The operating system 620 may include window, window CE, Mac OS, Linux, Unix, VMS, OS/2, solaris, Symbian OS, Palm OS, BSD, DOS. The operating system 620 may be driven by the central processing unit (CPU) 510 of the computing system 500.

The file system 630 may manage a storage space of the nonvolatile memory device 200/400 and data stored in the nonvolatile memory device 200/400. For example, the file system 630 FAT, FAT32, NTFS, HFS, JSF2, XFS, ODS-5, UDF, ZFS, UFS (Unix File System), ext2, ext3, ext4, ReiserFS, Reiser4, ISO 9660, Gnome, VFS, BFS or WinFS. The file system 630 may be driven by the central processing unit (CPU) 510 of the computing system 500.

The host driver 640 provides means which is required when the application 610, the operating system 620 and the file system 630 access the nonvolatile memory device 200/400. For example, if the nonvolatile memory device 200/400 is a flash memory device, the host driver 640 may include a flash conversion layer (FTL).

The flash conversion layer (FTL) may include mapping information for converting a logic address transmitted from the file system 630 to access a flash memory device into a physical address of a flash memory device. The flash conversion layer (FTL) may be configured to convert a logic address into a physical address of a flash memory device using mapping information. For example, the flash conversion layer (FTL) may be configured to perform a background operation such as a Garbage Operation and a Merge of a flash memory device.

The host driver 640 may be driven in the controller 100/300 of the memory system 10/20.

The nonvolatile memory device 200/400 may be configured to store data.

As described with reference to FIG. 5, when a read reclaim operation is performed in the controller 300, a read reclaim operation may be performed in the host driver 640.

A nonvolatile memory device in accordance to example embodiments compares a read time of a first address region with a reference time and store data in a second address region according to a comparison result. Thus, a read reclaim may be performed according to read characteristic of an address region.

The above-disclosed subject matter is to be considered illustrative, and not restrictive, and the appended claims are intended to cover all such modifications, enhancements, and other embodiments, which fall within the true spirit and scope of example embodiments. Thus, to the maximum extent allowed by law, the scope of example embodiments is to be determined by the broadest permissible interpretation of the following claims and their equivalents, and shall not be restricted or limited by the foregoing detailed description.

What is claimed is:

1. A method for operating a nonvolatile memory device, comprising:
   performing a read operation on a first address region;
   comparing a read time of the first address region with a reference time; and
   storing read data from the first address region in a second address region based on the comparison result.

2. The operation method of claim 1, wherein the storing stores the read data in the second address region if a result of the comparing indicates that the read time of the first address region is longer than the reference time.

3. The operation method of claim 2, wherein the performing the read operation on the first address region comprises:
   sensing data of memory cells corresponding to the first address region; and
   correcting errors of the sensed data.

4. The operation method of claim 3, wherein the read time of the first address includes a sensing time of the sensed data and a post-sensing time of the corrected errors.

5. The operation method of claim 1, wherein the performing the read operation on the first address region comprises:
   sensing data of memory cells corresponding to the first address region; and
   correcting errors of the sensed data.

6. The operation method of claim 5, wherein the storing the read data in the second address region includes storing in the second address regions the corrected sensed data.

7. The operation method of claim 6, wherein the correcting includes discriminating whether sensed data represents an erased state or programmed state 8. The operation method of claim 5, wherein the correcting includes discriminating whether sensed data represents an erased state or programmed state 9. The operation method of claim 5, wherein the read time of the first address includes a sensing time of the sensed data and a post-sensing time of the corrected errors.

10. The operation method of claim 1, wherein,
   the storing includes counting a number of times that the read time of the first address region is longer than the reference time, and
   the storing stores the read data in the second address region if a result of the counting indicates that the counted number is greater than a threshold value.

11. The operation method of claim 10, wherein the performing the read operation on the first address region comprises:
   sensing data of memory cells corresponding to the first address region; and
   correcting errors of the sensed data.

12. The operation method of claim 11, wherein the read time of the first address includes a sensing time of the sensed data and a post-sensing time of the corrected errors.

13. The operation method of claim 12, wherein, the reference time is an integer multiple of an average of the read time of the first address region.

14. The operation method of claim 1, wherein, the reference time is an integer multiple of an average of the read time of the first address region.

15. The operation method of claim 1, further comprising:
   mapping an access to the first address region to the second address region such that the first address region becomes unavailable if the storing stores the read data in the second address region.

16. A nonvolatile memory device comprising:
   a memory cell array;
   a read/write circuit configured to write data in the memory cell array and readout data from the memory cell array; and
   a control logic configured to control the read/write circuit according to the method of claim 1, wherein
   the control logic controls the read/write circuit so that the read data is stored in the second address region of the memory cell array if the read time of the first address region of the memory cell array is longer than the reference time.

17. The nonvolatile memory device of claim 16, wherein,
   the control logic includes an error correction unit, and
   the read time of the first address includes a sensing time where memory cells corresponding to the first address region are sensed and a post-sensing time where errors of the sensed data are corrected by the error correction unit.

18. A memory system comprising:
   a nonvolatile memory device; and
   a controller configured to control the nonvolatile memory device according to the method of claim 1, wherein
   the controller is configured to control the nonvolatile memory device so that the read data is stored in the second address region of the nonvolatile memory device if the read time of the first address region of the nonvolatile memory device is longer than the reference time.

19. The memory system of claim 18, wherein the nonvolatile memory device and the controller form a solid state disk/drive.

20. The memory system of claim 18, wherein the nonvolatile memory device and the controller form a memory card.

* * * * *